United States Patent
Sun et al.

(10) Patent No.: US 11,107,856 B2
(45) Date of Patent: Aug. 31, 2021

(54) MANUFACTURING METHOD OF IMAGE SENSING DEVICE

(71) Applicant: Wuhan Xinxin Semiconductor Manufacturing Co., Ltd., Wuhan (CN)

(72) Inventors: Peng Sun, Wuhan (CN); Xilong Wang, Wuhan (CN); Sheng Hu, Wuhan (CN)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 50 days.

(21) Appl. No.: 16/571,178

(22) Filed: Sep. 15, 2019

(65) Prior Publication Data
US 2020/0013824 A1    Jan. 9, 2020

Related U.S. Application Data

(63) Continuation of application No. PCT/CN2019/080030, filed on Mar. 28, 2019.

(30) Foreign Application Priority Data

Apr. 4, 2018 (CN) .......................... 201810299626.5
Mar. 27, 2019 (CN) .......................... 201910236411.3

(51) Int. Cl.
*H01L 27/146* (2006.01)

(52) U.S. Cl.
CPC .... *H01L 27/14698* (2013.01); *H01L 27/1464* (2013.01); *H01L 27/14636* (2013.01); *H01L 27/14643* (2013.01)

(58) Field of Classification Search
CPC ............................................... H01L 27/14698
See application file for complete search history.

(56) References Cited

U.S. PATENT DOCUMENTS

| | | | | |
|---|---|---|---|---|
| 2008/0073736 A1* | 3/2008 | Hwang | ............... | H01L 27/1462 257/432 |
| 2016/0133666 A1* | 5/2016 | Fenigstein | ........ | H01L 27/14685 257/49 |
| 2020/0286871 A1* | 9/2020 | Lift | ......................... | G02B 6/125 |

FOREIGN PATENT DOCUMENTS

JP    2000277719 A  * 10/2000

OTHER PUBLICATIONS

Machine translation of Shimizu (Year: 2000).*

* cited by examiner

*Primary Examiner* — Christopher A Johnson
(74) *Attorney, Agent, or Firm* — Winston Hsu

(57) ABSTRACT

A manufacturing method of an image sensing device includes the following steps. A substrate is provided. At least one image sensing unit is disposed in the substrate. A passivation layer is formed on the substrate. An auxiliary layer is formed on the passivation layer. A material composition of the auxiliary layer is different from a material composition of the passivation layer. An annealing process is performed to the substrate and the passivation layer. The passivation layer is covered by the auxiliary layer during the annealing process. The auxiliary layer is removed after the annealing process. The ability to constrain and/or passivate free charge in and/or near the passivation layer may be enhanced by performing the annealing process with the auxiliary layer covering the passivation layer. The electrical performance of the image sensing device may be improved accordingly.

11 Claims, 6 Drawing Sheets

MANUFACTURING METHOD OF IMAGE SENSING DEVICE

CROSS REFERENCE TO RELATED APPLICATIONS

This application is a continuation of International Application No. PCT/CN2019/080030 filed on Mar. 28, 2019, which is incorporated herein by reference in its entirety.

BACKGROUND OF THE INVENTION

1. Field of the Invention

The present disclosure relates to a manufacturing method of an image sensing device, and more particularly, to a manufacturing method of an image sensing device for improving electrical performance of the image sensing device.

2. Description of the Prior Art

Image sensors are devices capable of converting optical images into electrical signals and are widely used in various applications such as digital cameras and other optical electronic products. In recent years, complementary metal-oxide-semiconductor (CMOS) image sensor (hereinafter abbreviated as CIS) becomes a popular image sensing technology. The CIS is used to sense a volume of exposed light projected towards a semiconductor substrate. To do this, the CIS uses an array of pixels, or image sensor elements, to collect photo energy and convert images into electrical signals that can be used in a suitable application. A CIS pixel includes a photosensitive unit such as a photodiode to collect photo energy. In the CIS device, dark current is a relatively small electric current that flows through the photosensitive unit even when no photons are entering the device. The dark current consists of the charges generated in the image sensing device when no outside radiation is entering the device. The dark current has to be minimized to keep a good signal-to-noise (SN) ratio of the image sensing device. The number of white pixels (WP) on the CIS wafer refers to the number of pixels with a DN (digital number) value greater than 64 without being illuminated. The number of white pixels is an important parameter for evaluating the quality of the image sensing device and has to be reduced for improving the performance of the image sensing device.

SUMMARY OF THE INVENTION

A manufacturing method of an image sensing device is provided in the present disclosure. In the manufacturing method, an auxiliary layer is formed on a passivation layer and covers the passivation layer during an annealing process for enhancing the ability to constrain and/or passivate free charge in and/or near the passivation layer formed on a substrate including an image sensing unit disposed therein, and the electrical performance of the image sensing device may be improved accordingly.

According to an embodiment of the present disclosure, a manufacturing method of an image sensing device is provided. The manufacturing method includes the following steps. A substrate is provided. At least one image sensing unit is disposed in the substrate. A passivation layer is formed on the substrate. An auxiliary layer is formed on the passivation layer. A material composition of the auxiliary layer is different from a material composition of the passivation layer. An annealing process is performed to the substrate and the passivation layer. The passivation layer is covered by the auxiliary layer during the annealing process. The auxiliary layer is removed after the annealing process.

In some embodiments, the passivation layer includes a first dielectric layer, a second dielectric layer, and a third dielectric layer. The second dielectric layer is formed on the first dielectric layer, and the third dielectric layer is formed on the second dielectric layer. A material composition of the second dielectric layer is different from a material composition of the first dielectric layer and a material composition of the third dielectric layer.

In some embodiments, the first dielectric layer, the second dielectric layer, and the third dielectric layer are sequentially formed on the substrate.

In some embodiments, a dielectric constant of the second dielectric layer is higher than a dielectric constant of the first dielectric layer and a dielectric constant of the third dielectric layer.

In some embodiments, the auxiliary layer directly contacts the third dielectric layer, and the material composition of the auxiliary layer is different from a material composition of the third dielectric layer.

In some embodiments, the first dielectric layer comprises an oxide dielectric layer.

In some embodiments, the third dielectric layer comprises an oxide dielectric layer.

In some embodiments, the auxiliary layer comprises a nitride dielectric layer.

In some embodiments, a process temperature of the annealing process ranges from 200 degrees Celsius to 1000 degrees Celsius.

In some embodiments, the at least one image sensing unit comprises a photodiode of a back-side illumination (BSI) CMOS image sensor (CIS).

In some embodiments, the at least one image sensing unit comprises a photodiode of a front-side illumination (FSI) CMOS image sensor (CIS).

In some embodiments, a depletion region is formed in the substrate before the annealing process, and the depletion region is enlarged by the annealing process.

Other aspects of the present disclosure can be understood by those skilled in the art in light of the description, the claims, and the drawings of the present disclosure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 2-5 are schematic drawings illustrating a manufacturing method of an image sensing device according to an embodiment of the present disclosure, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
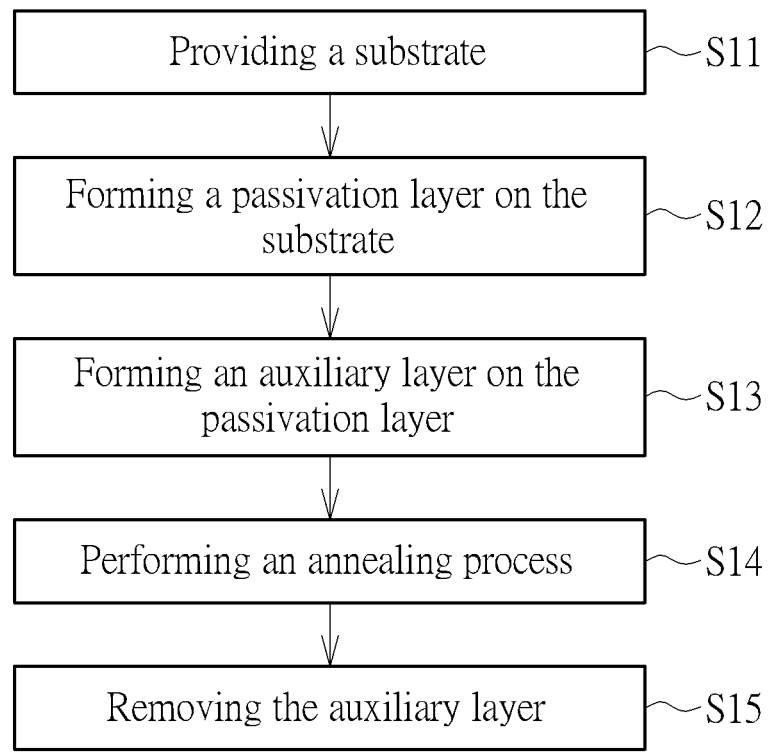
FIG. 1 is a flowchart of a manufacturing method of an image sensing device according to an embodiment of the present disclosure.
Figure 2:
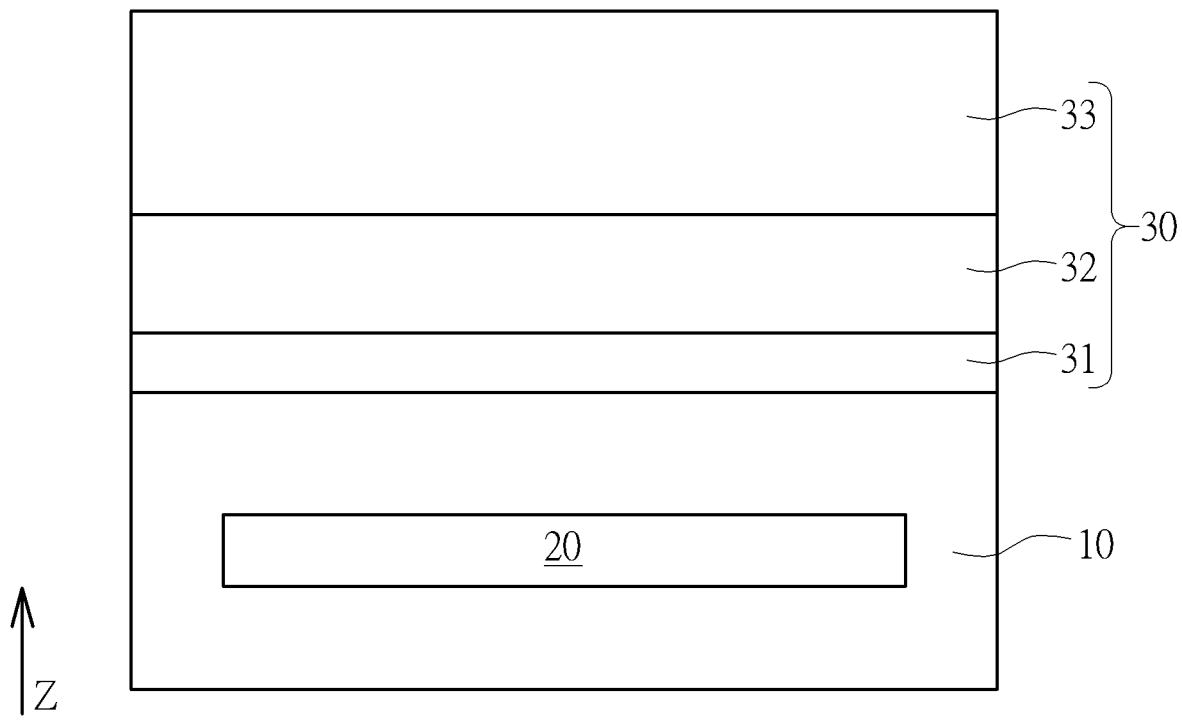
Figure 3:
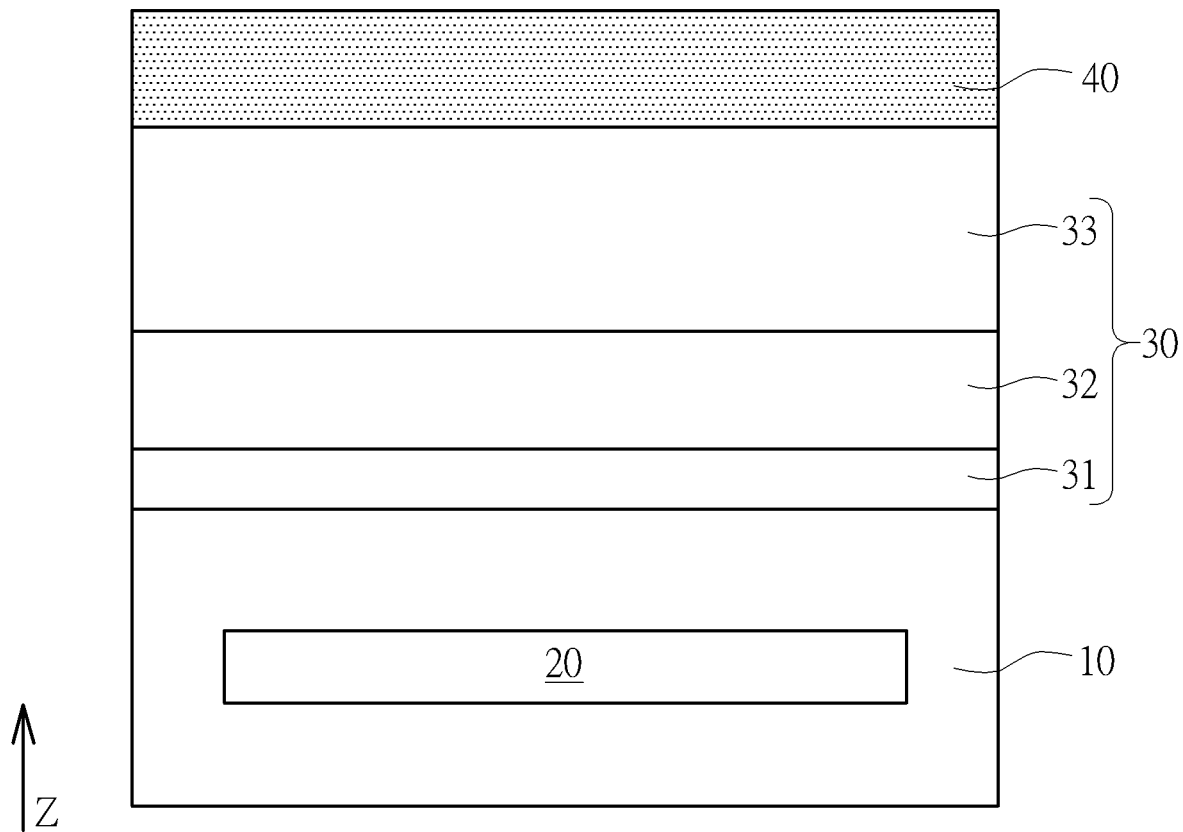
Figure 4:
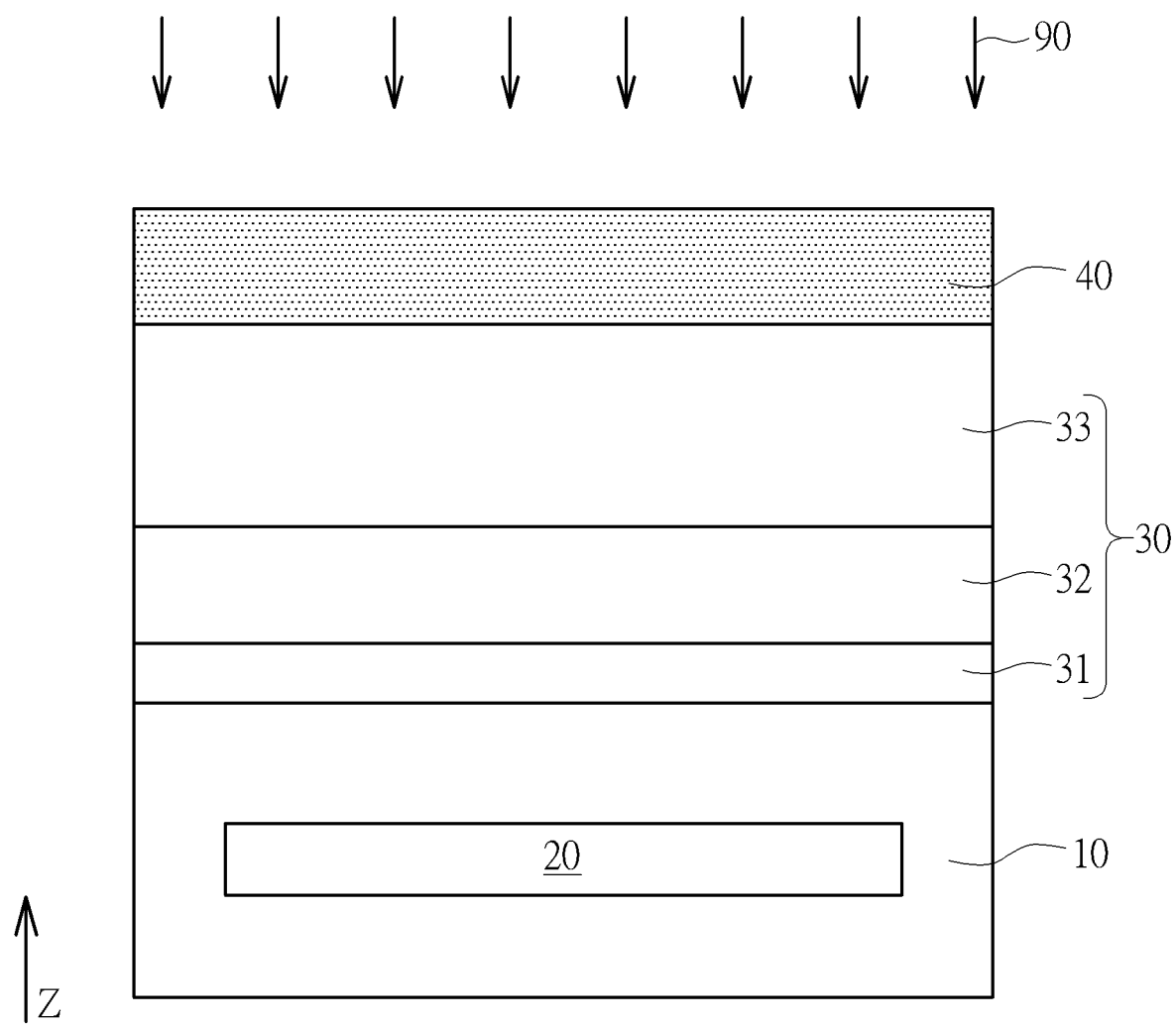
Figure 5:
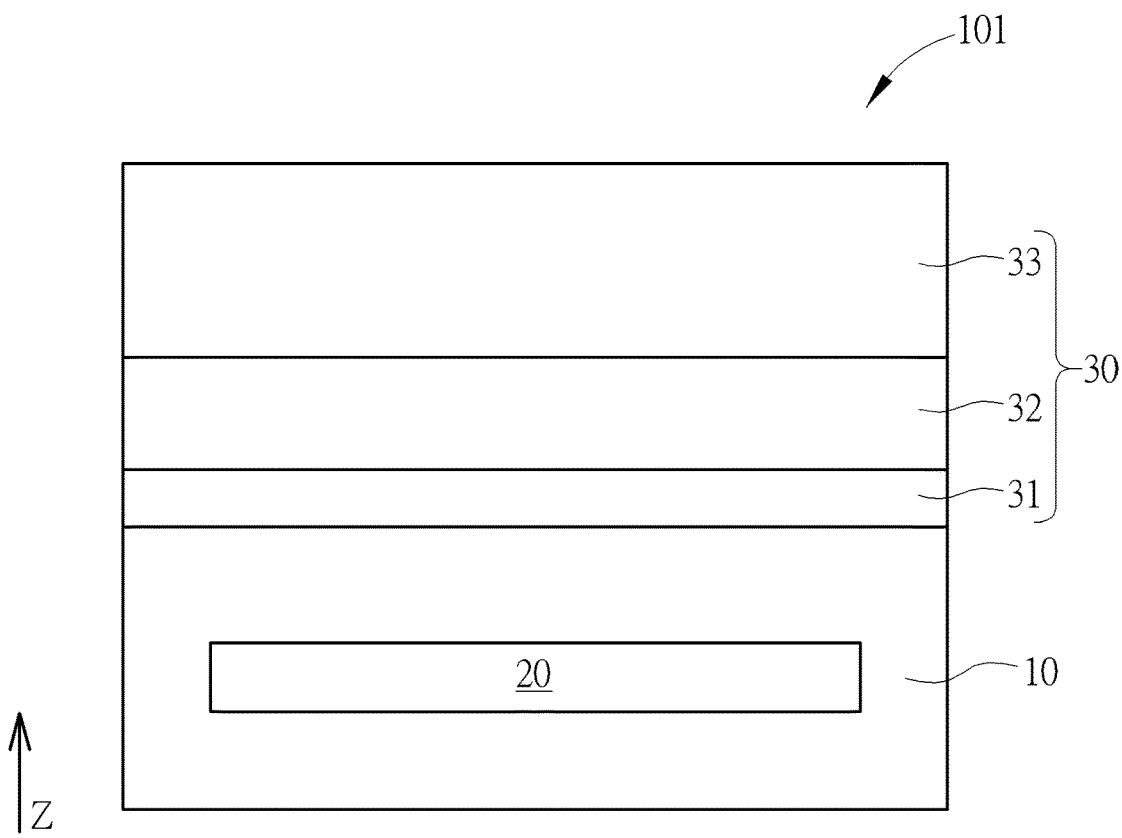

Please refer to FIGS. 1-5. FIG. 1 is a flowchart of a manufacturing method of an image sensing device according to an embodiment of the present disclosure. FIGS. 2-5 are schematic drawings illustrating a manufacturing method of an image sensing device according to an embodiment of the present disclosure, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4. The manufacturing method of the image sensing device includes the following steps. As shown in FIG. 1 and FIG. 2, in step S11, a substrate 10 is provided. At least one image sensing unit 20 is disposed in the substrate 10.

In some embodiments, the substrate 10 may include a semiconductor substrate, such as a silicon substrate, a silicon-containing substrate, a III-V group-on-silicon substrate (such as a GaN-on-silicon substrate), a silicon-on-insulator (SOI) substrate, or other suitable substrates. In some embodiments, the image sensing unit 20 may include a photoelectric conversion structure, such as a photodiode, photogate detector, phototransistor, or other suitable photoelectric conversion structures. In some embodiments, the image sensing unit 20 may include a photodiode of a back-side illumination (BSI) CMOS image sensor (CIS), a photodiode of a front-side illumination (FSI) CIS, or a photodiode of other suitable types of image sensors. The photodiode described above may be at least partially disposed in the semiconductor substrate described above, but not limited thereto. In some embodiments, other required units in the image sensing device, such as a capacitor, a control transistor, and an analog-to-digital converter (ADC), may be integrated in and/or disposed on the substrate 10.

Subsequently, in step S12, a passivation layer 30 is formed on the substrate 10. The passivation layer 30 may be regarded as a device proximity structure of the image sensing unit 20, but not limited thereto. In some embodiments, the passivation layer 30 may include one or more dielectric layers formed by a film forming process, such as a chemical vapor deposition (CVD) process, a physical vapor deposition (PVD) process, a coating process, or other suitable film forming approaches. In some embodiments, the passivation layer 30 may include a first dielectric layer 31, a second dielectric layer 32, and a third dielectric layer 33. The second dielectric layer 32 may be formed on the first dielectric layer 31, and the third dielectric layer 33 may be formed on the second dielectric layer 32. The second dielectric layer 32 may be sandwiched between the first dielectric layer 31 and the third dielectric layer 33 in a vertical direction Z. In some embodiments, the vertical direction Z may be regarded as a thickness direction of the substrate 10 and/or a thickness direction of the passivation layer 30, but not limited thereto.

In some embodiments, the material composition of the second dielectric layer 32 may be different from the material composition of the first dielectric layer 31 and the material composition of the third dielectric layer 33. For example, the second dielectric layer 32 may be a high dielectric constant (high-k) dielectric layer. The first dielectric layer 31 and the third dielectric layer 33 may respectively include an oxide dielectric layer having a relatively lower dielectric constant. Therefore, in some embodiments, the dielectric constant of the second dielectric layer 32 may be higher than the dielectric constant of the first dielectric layer 31 and the dielectric constant of the third dielectric layer 33, but not limited thereto. The high-k dielectric layer mentioned above may include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), chromium dioxide ($CrO_2$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), or other suitable high-k dielectric materials. In some embodiments, the first dielectric layer 31 and the third dielectric layer 33 may respectively include a silicon oxide layer, such as a silicon dioxide ($SiO_2$) layer, or other suitable oxide materials.

In some embodiments, the first dielectric layer 31, the second dielectric layer 32, and the third dielectric layer 33 may be sequentially formed on the substrate 10. Therefore, the first dielectric layer 31 may directly contact the top surface of the substrate 10, the second dielectric layer 32 may directly contact the top surface of the first dielectric layer 31, and the third dielectric layer 33 may directly contact the top surface of the second dielectric layer 32, but not limited thereto. In some embodiments, the processes of forming the first dielectric layer 31, the second dielectric layer 32, and the third dielectric layer 33 may be performed sequentially in the same film forming apparatus and/or in the same process chamber for reducing influence from external environment.

As shown in FIG. 1 and FIG. 3, in step S13, an auxiliary layer 40 is formed on the passivation layer 30. The auxiliary layer 40 may be formed by a film forming process, such as a CVD process, a PVD process, a coating process, or other suitable film forming approaches. The material composition of the auxiliary layer 40 may be different from the material composition of the passivation layer 30. In some embodiments, the material composition of the auxiliary layer 40 may be different from the material composition of the first dielectric layer 31, the material composition of the second dielectric layer 32, and/or the material composition of the third dielectric layer 33, but not limited thereto. In some embodiments, the auxiliary layer 40 may include a nitride dielectric layer (such as a silicon nitride layer) or other suitable dielectric materials different from the material of the third dielectric layer 33. In some embodiments, the auxiliary layer 40 may directly contact the top surface of the third dielectric layer 33, and the auxiliary layer 40 may overlap the passivation layer 30 in the vertical direction Z.

As shown in FIG. 1 and FIG. 4, in step S14, an annealing process 90 is performed to the substrate 10 and the passivation layer 30 after the step of forming the auxiliary layer 40. The passivation layer 30 may be covered by the auxiliary layer 40 during the annealing process 90. In some embodiments, a process temperature of the annealing process 90 may range from 200 degrees Celsius to 1000 degrees Celsius, but not limited thereto. For example, the process temperature of the annealing process 90 may be about 250 degrees Celsius, 350 degrees Celsius, 400 degrees Celsius, 500 degrees Celsius, 600 degrees Celsius, 700 degrees Celsius, 800 degrees Celsius, 900 degrees Celsius, or any other value ranging from 200 degrees Celsius to 1000 degrees Celsius.

As shown in FIG. 1, FIG. 4 and FIG. 5, in step S15, the auxiliary layer 40 is removed after the annealing process 90. In some embodiments, the auxiliary layer 40 may be removed by an etching process, such as a dry etching process and/or a wet etching process. In some embodiments, the auxiliary layer 40 may also be removed by other suitable approaches according to the material properties of the auxiliary layer 40. In addition, the auxiliary layer 40 may be completely removed from the passivation layer 30, and there is not any residue of the auxiliary layer 40 on the passivation layer 30 after the step of removing the auxiliary layer 40. After the manufacturing method described above, an image sensing device 101 shown in FIG. 5 may be obtained. The image sensing device 101 includes the substrate 10 and the passivation layer 30 disposed on the substrate 10, and at least one image sensing unit 20 is disposed in the substrate 10.

Figure 6:
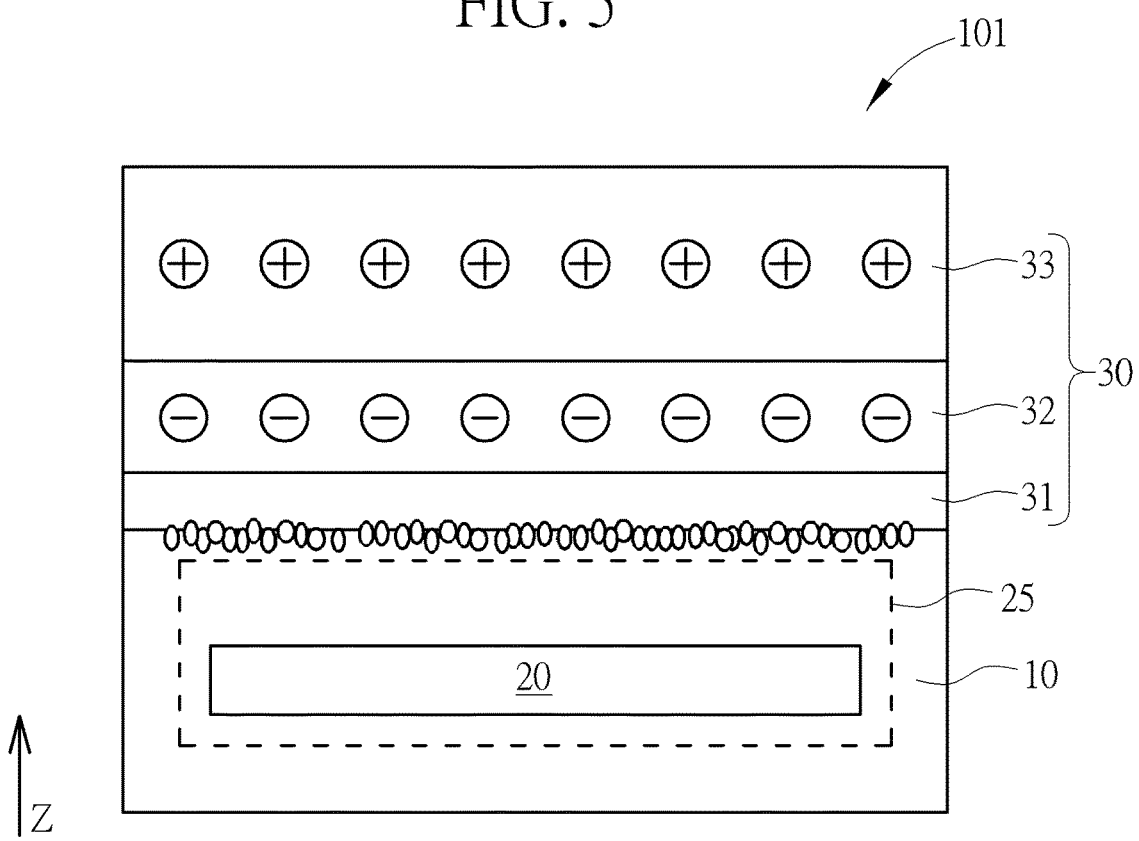
FIG. 6 is a schematic drawing illustrating a charge distribution in an image sensing device according to an embodiment of the present disclosure.
Figure 7:
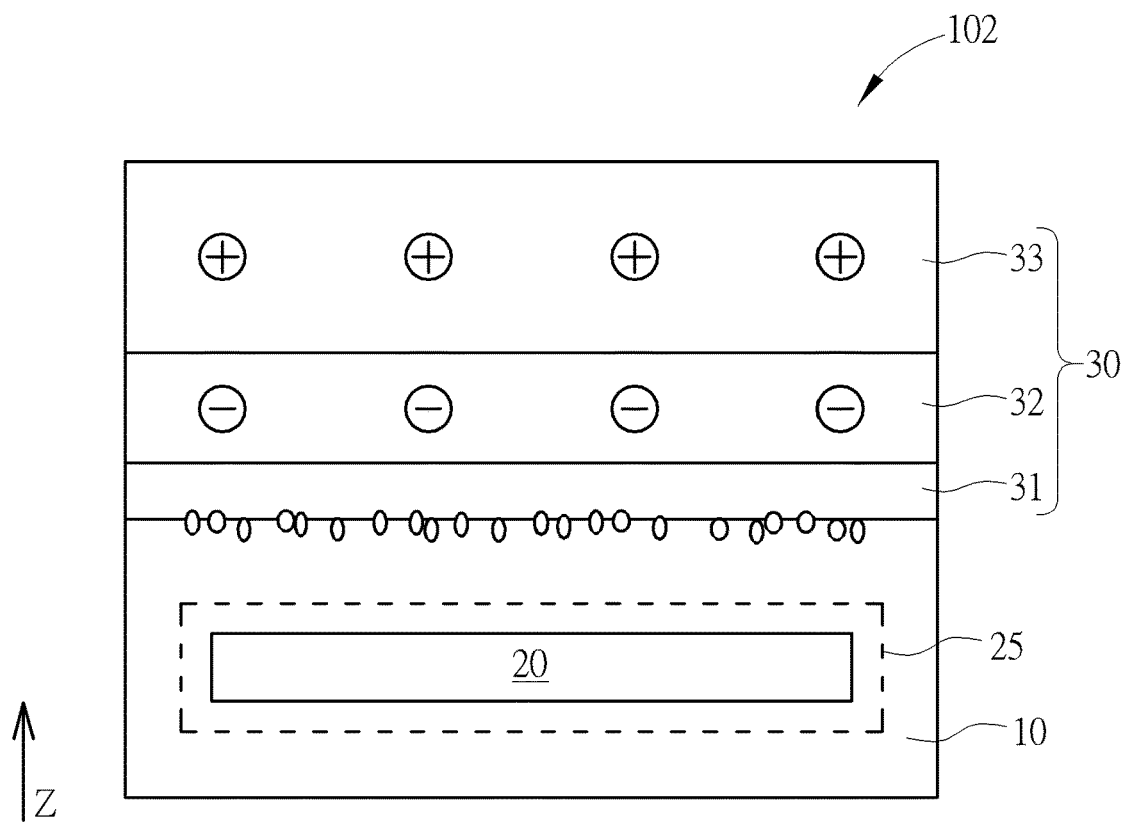
FIG. 7 is a schematic drawing illustrating a charge distribution in an image sensing device according to another embodiment of the present disclosure.

Please refer to FIG. 6 and FIG. 7. FIG. 6 is a schematic drawing illustrating a charge distribution in the image sensing device 101. FIG. 7 is a schematic drawing illustrating a charge distribution in an image sensing device 102 according to another embodiment of the present disclosure. As shown in FIG. 6 and FIG. 7, the image sensing device 101 is formed by the manufacturing method described above, and the image sensing device 102 may be formed by a manufacturing method similar to the manufacturing method of the image sensing device 101 except the step of forming the auxiliary layer and the annealing process performed with auxiliary layer covering the passivation layer 30. In some embodiments, a final annealing process may be performed after the step of forming the passivation layer 30 in the manufacturing method of the image sensing device 102, and there is not any final annealing process performed after the step of removing the auxiliary layer in the manufacturing method of the image sensing device 101, but not limited thereto.

As shown in FIG. 6 and FIG. 7, more free charge may be constrained and/or passivated in the passivation layer 30 of the image sensing device 101, and more dangling bonds at the interface between the substrate 10 and the first dielectric layer 31 of the image sensing device 101 may be passivated accordingly. In other words, the step of forming the auxiliary layer and the annealing process performed with auxiliary layer covering the passivation layer 30 described above may be used to enhance the ability to constrain and/or passivate free charge in and/or near the passivation layer 30, which may be regarded as a device proximity structure of the image sensing unit 20, and the electrical performance of the image sensing device 101 may be improved accordingly.

Figure 8:
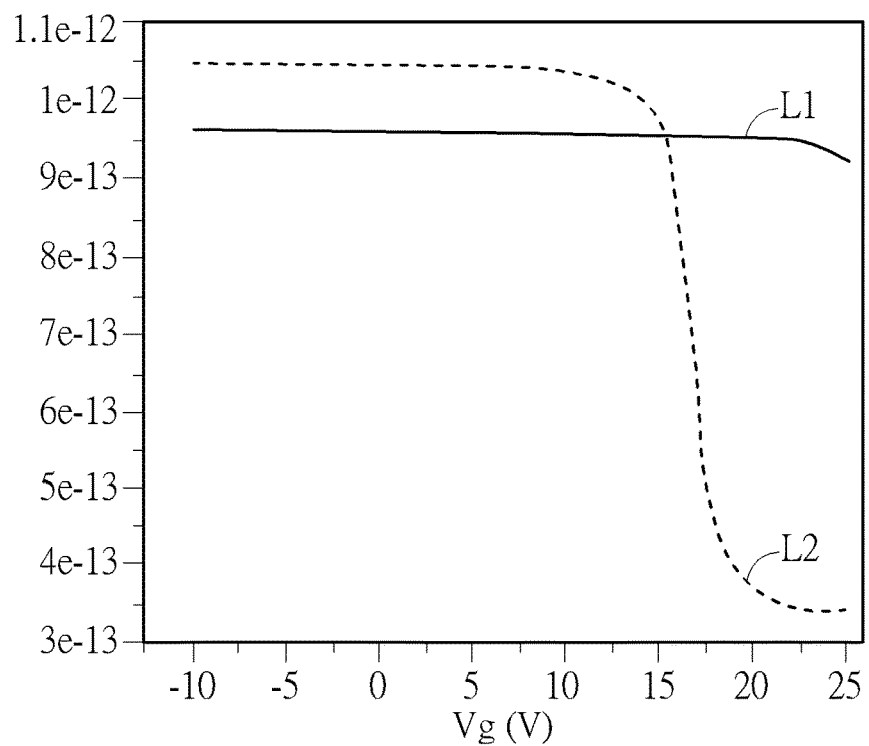
FIG. 8 is a diagram illustrating capacitance-voltage characteristics of an image sensing device according to an embodiment of the present disclosure.

Please refer to FIGS. 6-8. FIG. 8 is a diagram illustrating capacitance-voltage characteristics of an image sensing device according to an embodiment of the present disclosure. Specifically, a line L1 in FIG. 8 may represent the capacitance-voltage characteristics of the image sensing device 101, and a line L2 in FIG. 8 may represent the capacitance-voltage characteristics of the image sensing device 102. As shown in FIGS. 6-8, the flat band voltage (Vfb) of the image sensing device 102 may be about 17.3V, and the flat band voltage of the image sensing device 101 may be higher than 25V. In other words, the step of forming the auxiliary layer and the annealing process performed with auxiliary layer covering the passivation layer 30 described above may be used to enhance the ability to constrain and/or passivate free charge in and/or near the passivation layer 30, which may be regarded as a device proximity structure of the image sensing unit 20, and the flat band voltage of the image sensing device 101 may be increased accordingly.

Figure 9:
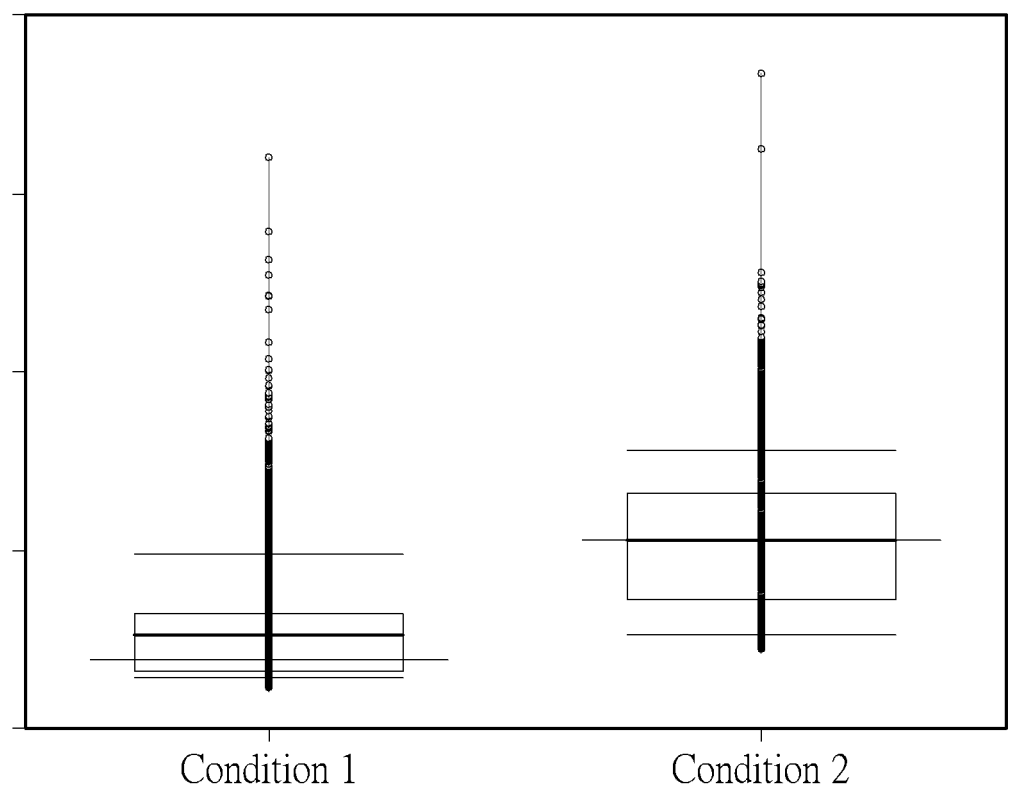
FIG. 9 is a boxplot illustrating numbers of white pixels in image sensing devices under different conditions of the present disclosure.

Please refer to FIG. 6, FIG. 7, and FIG. 9. FIG. 9 is a boxplot illustrating numbers of white pixels in image sensing devices under different conditions of the present disclosure. Specifically, the condition 1 in FIG. 9 may represent the number of white pixels in image sensing devices formed by the manufacturing method of the image sensing device 101, and the condition 2 in FIG. 9 may represent the number of white pixels in image sensing devices formed by the manufacturing method of the image sensing device 102. It is worth noting that FIG. 9 is used to describe a relative improvement in the number of white pixels between different conditions, and the specific number of white pixels is not shown in FIG. 9 accordingly. The number of white pixels on an image sensing device may refer to the number of pixels with a DN (digital number) value greater than 64 without being illuminated, and the number of white pixels is an important parameter for evaluating the quality of the image sensing device and has to be reduced for improving the performance of the image sensing device. As shown in FIG. 5, FIG. 6, FIG. 7, and FIG. 9, the number of white pixels in image sensing devices formed by the manufacturing method of the image sensing device 101 may be reduced significantly. Therefore, the step of forming the auxiliary layer and the annealing process performed with auxiliary layer covering the passivation layer 30 described above may be used to enhance the ability to constrain and/or passivate free charge in and/or near the passivation layer 30, which may be regarded as a device proximity structure of the image sensing unit 20, and the number of white pixels in the image sensing device 101 may be reduced accordingly.

As shown in FIG. 6 and FIG. 7, in some embodiments, a depletion region 25 may be formed in the substrate 10 before the annealing process (such as the annealing process 90 shown in FIG. 4). In some embodiments, the depletion region 25 may be a depletion layer of the photodiode, and the depletion region 25 may be formed by an implantation process or other suitable approaches. In some embodiments, the depletion region 25 in the image sensing device 101 may be larger than the depletion region 25 in the image sensing device 102. The step of forming the auxiliary layer and the annealing process performed with auxiliary layer covering the passivation layer 30 described above may be used to enhance the ability to constrain and/or passivate free charge in and/or near the passivation layer 30, which may be regarded as a device proximity structure of the image sensing unit 20, and more dangling bonds at the interface between the substrate 10 and the first dielectric layer 31 of the image sensing device 101 may be passivated. Accordingly, the depletion region 25 may be enlarged by the annealing process, and the performance of the image sensing device 101 may be improved.

To summarize the above descriptions, in the manufacturing method of the image sensing device according to the present disclosure, the auxiliary layer is formed on the passivation layer and covers the passivation layer during the annealing process for enhancing the ability to constrain and/or passivate free charge in and/or near the passivation layer formed on the substrate including the image sensing unit disposed therein, and the electrical performance of the image sensing device, such as the white pixel defect density, may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an image sensing device, comprising:
providing a substrate, wherein at least one image sensing unit is disposed in the substrate;
forming a passivation layer on the substrate;
forming an auxiliary layer on the passivation layer, wherein a material composition of the auxiliary layer is different from a material composition of the passivation layer;
performing an annealing process to the substrate and the passivation layer, wherein the passivation layer is covered by the auxiliary layer during the annealing process, and dangling bonds at an interface between the substrate and the passivation layer are passivated by the annealing process, wherein a depletion region is formed in the substrate before the annealing process, and the depletion region is enlarged by the annealing process; and
removing the auxiliary layer after the annealing process.

2. The manufacturing method of the image sensing device according to claim 1, wherein the passivation layer comprises:
a first dielectric layer;
a second dielectric layer formed on the first dielectric layer; and
a third dielectric layer formed on the second dielectric layer, wherein a material composition of the second dielectric layer is different from a material composition of the first dielectric layer and a material composition of the third dielectric layer.

3. The manufacturing method of the image sensing device according to claim 2, wherein the first dielectric layer, the second dielectric layer, and the third dielectric layer are sequentially formed on the substrate.

4. The manufacturing method of the image sensing device according to claim 2, wherein a dielectric constant of the second dielectric layer is higher than a dielectric constant of the first dielectric layer and a dielectric constant of the third dielectric layer.

5. The manufacturing method of the image sensing device according to claim 2, wherein the auxiliary layer directly contacts the third dielectric layer, and the material composition of the auxiliary layer is different from a material composition of the third dielectric layer.

6. The manufacturing method of the image sensing device according to claim 2, wherein the first dielectric layer comprises an oxide dielectric layer.

7. The manufacturing method of the image sensing device according to claim 2, wherein the third dielectric layer comprises an oxide dielectric layer.

8. The manufacturing method of the image sensing device according to claim 1, wherein the auxiliary layer comprises a nitride dielectric layer.

9. The manufacturing method of the image sensing device according to claim 1, wherein a process temperature of the annealing process ranges from 200 degrees Celsius to 1000 degrees Celsius.

10. The manufacturing method of the image sensing device according to claim 1, wherein the at least one image sensing unit comprises a photodiode of a back-side illumination (BSI) CMOS image sensor (CIS).

11. The manufacturing method of the image sensing device according to claim 1, wherein the at least one image sensing unit comprises a photodiode of a front-side illumination (FSI) CMOS image sensor (CIS).

* * * * *